United States Patent [19]
Dinglreiter et al.

[11] Patent Number: 5,512,161
[45] Date of Patent: Apr. 30, 1996

[54] PROCESS FOR GALVANICALLY FORMING STRUCTURED PLATE-SHAPED BODIES

[75] Inventors: Heinz Dinglreiter, Forst; Helmut Kalb, Eggenstein-Leo.; Richard Rapp, Stutensee, all of Germany

[73] Assignee: Kernforschungszentrum Karlsruhe GmbH, Karlsruhe, Germany

[21] Appl. No.: 404,173

[22] Filed: Mar. 6, 1995

[30] Foreign Application Priority Data

Sep. 23, 1992 [DE] Germany ............ 42 31 742.8

[51] Int. Cl.⁶ .................................. C25D 1/10
[52] U.S. Cl. .............................. 205/67; 205/70
[58] Field of Search ............... 205/67, 70, 118, 205/75, 76, 122, 68, 69

[56] References Cited

U.S. PATENT DOCUMENTS

| | | | |
|---|---|---|---|
| 3,022,230 | 2/1962 | Fialkoff | 205/73 |
| 5,073,237 | 12/1991 | Bacher | 264/320 |
| 5,234,571 | 8/1993 | Noeker | 205/70 |

FOREIGN PATENT DOCUMENTS

| | | |
|---|---|---|
| 0273552 | 7/1988 | European Pat. Off. . |
| 0331208 | 9/1989 | European Pat. Off. . |
| 0476867 | 3/1992 | European Pat. Off. . |
| 1621034 | 2/1967 | Germany . |
| 3442781 | 6/1989 | Germany . |
| 4010669 | 4/1991 | Germany . |

OTHER PUBLICATIONS

Abstract of JP Kokei No. 53-106643.
Patent Abstract of Japan, C-861, Aug. 23 vol. 15, No. 332.

*Primary Examiner*—John Niebling
*Assistant Examiner*—Brendan Mee
*Attorney, Agent, or Firm*—Klaus J. Bach

[57] ABSTRACT

In a process for galvanically forming structured plate-like bodies, wherein a layer of a plastic material is structured at one side and structure bodies with plane front surfaces are formed thereon so as to rise from a contiguous electrically conductive base, the front surfaces of the structure bodies are provided with isolated spangles of electrically conductive material which are electrically insulated from each other and sized and spaced such that a line across a front surface intersects at least one of the spangles and the structure base—used as a cathode—and the structured bodies are then galvanically covered with a metal to form the structured plate on the layer of plastic material.

4 Claims, 3 Drawing Sheets

PROCESS FOR GALVANICALLY FORMING STRUCTURED PLATE-SHAPED BODIES

This is a continuation-in-part application of international application PCT/EP93/02482 of Sep. 14, 1993 claiming the priority of German application P 42 31 742.8 filed Sep. 23, 1992.

BACKGROUND OF THE INVENTION

The invention resides in a method of galvanically forming structured plate-like bodies which are structured at one side such that the structures project from a base representing a contiguous electrically conductive surface to which the structure tops are parallel wherein the base is galvanically covered by a metal.

In microstructuring techniques, it is often necessary to galvanically form, by metal deposition, a structure from a plastic plate provided with micro structured bodies by means of microforming techniques or X-ray depth lithography. The microstructured bodies on the plastic plate are formed in such a way that the structure base, that is the surface from which the microstructures rise, is electrically conductive. The easiest way to provide such an electrically conductive surface is to attach the plastic plate to a metal plate and to remove plastic material around the microstructures to be formed down to the metal plate so that the microstructures are disposed directly on the metal plate and the exposed portions of the metal plate form the structure base. Negative shapes of the microstructured bodies can then be formed galvanically in a galvanic bath in which the metal plate is used as a cathode. In this process, first the interstices between the structured bodies are filled from the structure base on. Upon continuation of the galvanic process, the micro structured bodies are finally covered with metal as the nonconductive microstructured body front surfaces are overgrown. At the end of the process, the microstructured bodies are totally embedded in the metal. Such a process is disclosed for example in U.S. Pat. No. 5,073,237. A process for the galvanic forming of plate-like bodies provided with microstructures is disclosed in this patent. The process described therein serves to provide negative forms of microstructured plate-like bodies which can serve as galvanic molds and whose structure base is a contiguous surface covered with a layer of an electrically conductive material, wherein the electrically conductive material layer is used as a cathode in the subsequent galvanic forming step.

The process utilizes a thermoplastic material layer on which a film of an electrically conductive material is deposited. A microstructured mold insert is impressed into the thermoplastic material layer through the electrically conductive material and is then again removed. With this process, a continuous electrically conductive structure base is formed. During impression of the mold insert into the film-covered thermoplastic material layer, the film ruptures where it is engaged by the micro structures of the mold insert. Upon removal of the mold insert, small, isolated spangles of the film material, which are electrically insulated from one another remain on the vertical wall portions and on the front faces of the microstructures. On the structure base of the negative form however, the film remains undisturbed. With regard to the spangles remaining on the micro structure surfaces of the negative form, it is pointed out that, because of their isolated arrangement, they are electrically insulated from the structure base and therefore, do not prevent exact galvanic forming from the negative mold.

The purpose of this method resides in the formation of a contiguous, electrically conductive structure base which is fully covered by the film of electrically conductive material. The isolated spangles of the film occur as side effects and are therefore—dependent on the thickness of the film and on the shape of the micro structures—distributed on the microstructures in an incidental and non-reproducible manner.

In accordance with the Abstract of J. P. Kokei No. 53-106 643, a plastic substrate is, by means of a molding tool, so structured that concave depressions and convex structure bodies are generated. The plastic substrate is subsequently coated over its whole surface with a thin layer of an electrically conductive material. Then, only those parts of the electrically conductive material are removed which are disposed on the front faces of the convex structure bodies. Subsequently, the concave depressions are galvanically filled with the electrically conductive material. The electrically conductive material projecting beyond the from surfaces of the convex structure bodies is then removed. Since the galvanically deposited material and the convex structure bodies are to have the same height, no problems are encountered by the overgrowth of the galvanic deposits over the front faces.

DE 34 42 781.C2 discloses a method of producing an adjustment disc for cameras wherein a regular relief structure is formed on the top surface of a metal plate by mechanical treatment thereof. The relief structure is then subjected to normal galvanic treatment wherein an emulsion is added to the galvanizing bath which, with a local and timely statistical distribution, inhibits the galvanic deposition and forms the pattern obtained thereby, onto an optical material. With the known method, a metal is galvanically deposited on the whole mechanically structured metal plate, the structure base as well as the structure bodies are electrically conductive. The emulsion inhibits the galvanic deposition on small statistically distributed spots.

The publication Patent Abstracts of Japan, C-861, Aug. 23, 1991, Vol. 15, No. 332 [Abstract of JP 3-126,887(A)] describes a method wherein metal powder such as nickel powder, is admixed to a liquid resin. The resin with the metal powder is then filled into a negative form and is cured. The surface of the cured resin is then ground so that a smooth surface is generated on which the powder is exposed. The mold is then placed in a galvanic cell wherein nickel is deposited on the surface of the mold in order to provide a space for the galvanic deposition. In this process, the form does not need to be directly polished since, in this case, the resin is made electrically conductive by the addition of a metal powder. Relatively high concentrations of metal powder have to be used which noticeably change the properties of the resin.

DE-OS16 21 034 discloses a method of making a mold for the galvano-plastic manufacture of sieves, cuttable foils, filters, grids, or similar articles wherein a light sensitive photo layer is disposed on a polished, cleaned metal plate and is exposed to light with the desired pattern. After being developed, the areas exposed to light are covered and the non-exposed areas are dissolved and the metal plate is then etched at the exposed areas to form depressions. According to this known process, the metal plate with the etched depressions from which the exposed photolayer has been removed, is covered and the etched depressions are filled with a hardenable electrically conductive plastic. After hardening, the metal plate and the layer of electrically conductive plastic, not the metal plate, is used for the galvanic molding procedure.

The plastic layer is electrically conductive at all structure areas. The process is not concerned with the galvanic molding.

The present invention is concerned with the problem of evenly growing galvanically deposited material over an electrically non-conductive surface as it is present in the initially referred to normal case on the front surface of structured plastic bodies. The galvanic overgrowth over the front surface of the structure bodies starts at an electrically conductive base, which, as initially mentioned, is slowly built up and fills the depressions or cavities until the microstructure bodies are overgrown and embedded.

This galvanic procedure involves two different processes: the vertical growth in which deposition of the material to be galvanically deposited occurs by way of an electrically conductive metal layer serving as a cathode or on the metal already deposited on the metal layer, and the lateral growth which occurs when the level of the front surface of the microstructures has been reached whereby those front surfaces are finally fully covered with metal.

The speed of the lateral growth under the usual galvanization conditions (nickel sulfate electrolyte, current density 1A/dm$^2$) is normally on the same order as the vertical growth, that is, it is about 12 µ/h. During the galvanic overgrowth of stepped structured bodies, it is even possible that faults occur at the level of the intermediate and the upper front surfaces when the galvanic growth fronts meet.

Basically, it would seem helpful to apply to the front faces of the structured bodies a continuous conductive layer which is isolated from the structure base. In this manner, a lateral growth could be achieved with increased speed with regard to the vertical growth. In this case, a sudden contact of the adjacent front faces with the metal grown between the micro-structured bodies would render the whole front face areas cathodic. However, since the rate of metal deposition between the structured bodies is uneven, the formation of such sudden contacts may have the result that further vertical growth in the areas where the galvanic growth has not yet reached the front faces of the structured bodies is interrupted by the galvanic lateral growth. The result will then be that some of the particular structured bodies are not formed and are missing in the galvanically deposited body. At these locations, the galvanically formed product will have cavities. This effect will be greater for larger aspect ratios (relation of height to the width of the bodies) of structured bodies and for greater aspect ratio differences in a particular micro-structure.

It is the object of the present invention to provide a method with which the problems related to the cross-sectional growth of galvanically deposited metal structures are prevented.

SUMMARY OF THE INVENTION

In a process for galvanically forming structured plate-like bodies, wherein a layer of a plastic material is structured at one side and structure bodies with plane front surfaces are formed thereon so as to rise from a contiguous electrically conductive base, the front surfaces of the structure bodies are provided with isolated spangles of electrically conductive material which are electrically insulated from each other and sized and spaced such that a line across a front surface intersects at least one of the spangles and the structure base—used as a cathode—and the structured bodies are then galvanically covered with a metal to form the structured plate on the layer of plastic material.

The invention is not limited to microstructures. It can also be utilized for the manufacture of larger structures measured in millimeters.

An essential feature of the method according to the invention is that, on the structure body front surfaces, an array of small isolated spangles is formed. The size of the particular spangles depends on the size of the front surfaces of the structure bodies. The largest diameter of the particular spangles should be such that several spangles are disposed on each front face in each direction. If the front face of a structured body has, for example a stepped shape, the diameter of the spangles should be such that also over the width of a step there is space for at least one isolated spangle. All the front faces must be covered with the pattern of spangles before the galvanizing process begins and in each direction there should be at least one spangle.

In principle, such a pattern can be generated before or after the structuring of the plate. In each case, the arrangement described above can be produced before the galvanizing step. If one starts out with a plastic plate covered with a layer of electrically conductive material, the spangle pattern can be generated already on this arrangement before structuring takes place. For the spangle sizes, the dimensions of the front surfaces to be subsequently generated have to be considered, of course. But the pattern of spangles may also be provided on the front faces of the structure bodies after they have been formed.

Such a pattern cannot be formed in accordance with the method given in U.S. Pat. No. 5,073,237 discussed earlier, since, in this publication, the spangles are formed in a non-reproducible manner and have an accidental size distribution.

With the method according to the invention, the galvanic overgrowth of the front faces occurs in such a way that the various spangles which have already been electrically contacted by the vertical growth provide for a step-like increasing galvanic deposition area on the front faces of the structures. Since the spangles themselves are electrically conductive, metal is deposited on the whole spangle as soon as the spangle is contacted by the growth front on the structure front surfaces which then continues to overgrow the spaces between the spangles. As soon as the metallic growth front reaches the next spangle, the whole spangle becomes part of the cathode deposition area and the lateral growth continues from the edges of the spangle. In this manner, lateral growth on the surfaces is accelerated with respect to vertical growth.

Consequently, it is possible to control the lateral overgrowth speed over non-conductive surfaces as desired. Assuming, for example, a uniform arrangement of the conductive spangles (distance: b) and an identical spangle size (characteristic size, that is, diameter:a) the speed of lateral growth is:

$$V_{lateral,coated} = (a+b)/b \times V_{vertical}$$

This applies if, with an uncoated surface that is a front surface without spangle arrangement according to the invention, there is some growth speed in any direction which can be assumed to be reasonably true. Otherwise, the equation applies:

$$V_{lateral,coated} = (a+b)/V_{lateral,uncoated}.$$

Furthermore, by a predetermined non-uniform arrangement of the spangles or the predetermined arrangement of larger spangles, the lateral overgrowth speed can be adjusted to requirements of a given design arrangement, the method according to the invention can consequently be adjusted to the given requirements, that is, it can be utilized in a feasible manner.

Spangle geometry, spangle size, spangle distance and spangle thickness (and consequently, the thickness of the conductive material) can be selected as desired; they are limited only by the requirements of the method used for providing the spangles. The thickness of the spangles may be 10 to 10,000 nm, preferably about 50–300 nm, (like in U.S. Pat. No. 5,073,237 discussed earlier). Typical dimensions for the spangle diameter are 5 to 50 By selecting a suitable spangle geometry, such as a frame or ring shape, the spangle-covered surface area may be limited to a minimum. It is, for example, without effect on the speed of the lateral galvanic growth whether the spangles are electrically fully conductive or whether only their outer edges are electrically conductive while the center portions of the spangles are non-conductive.

For the formation of a continuous layer of the electrically conductive material or surface areas provided with a spangle pattern, there are at least two possibilities: the molding procedure wherein, in accordance with the earlier discussed U.S. Pat. No. 5,073,237, a microstructured plate-like molding tool is formed, or optical, that is, X-ray depth lithography is utilized. In the first case, it is necessary to use a plastic material with thermoplastic properties. In the second case, the plastic consists of one of the known optical or X-ray resist materials such as polymethylmethacrylate (PMMA) or a PIQ lacquer.

In both cases the micro structuring has to be done in such a way that the structure base has a continuous electrically conductive surface, which in the galvanizing bath, is connected so as to form a cathode. With a shaping procedure, the structure base can be made electrically conductive by stamping the structure on a composite layer of a thermoplastic material with an electrically conductive top layer (for example a metal or carbon layer). This procedure, however, has limits with regard to shape: the structure base has to be a contiguous surface throughout. With X-ray lithography, a metallic base plate with X-ray resist polymers thereon can be utilized. This procedure has no limits with regard to the shape since the metallic base plate always provides for a contiguous structure base.

For making the pattern of small spangles which are electrically insulated from one another, there are at least three processes, A, B, and C which will be described in greater detail on the basis of drawings.

DESCRIPTION OF THE PREFERRED EMBODIMENT

The various methods will be illustrated for a microstructuring procedure on the basis of X-ray lithography wherein the plastic layer (here the layer of X-ray resist material) is covered, before the micro structuring procedure, with a layer of the electrically conductive material to form a plate with a conductive surface. Then the plate is microstructured by X-ray depth lithography. The advantage of this procedure is that it makes sure that only the front surfaces of the microstructures are coated but not the vertical side surfaces of the microstructure bodies. In the subsequent galvanizing process, first the cavities between the microstructure bodies are filled starting with the electrically conductive structure base. As soon as the galvanically deposited material reaches the front faces of the microstructures, the spangles of conductive material on the faces are contacted one after the other by the lateral growth of the metal being deposited, whereby lateral overgrowth on the front faces is greatly accelerated. However, since no sudden contact is provided for the whole front surface, the disadvantages described earlier are avoided.

FIGS. 1 to 7 show the formation of a standard layer by microstructure molding and mechanical machining in accordance with process A.

Figure 1:
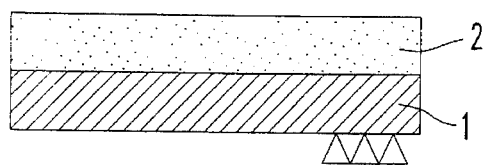
FIG. 1 to FIG. 7 show the process A.

As shown in FIG. 1, a flat X-ray resist layer 2 of PMMA is polymerized onto a metallic base plate 1, which is flat on both sides.

Figure 2:
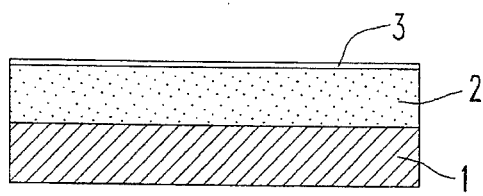

The whole upper side of the X-ray resist layer 2 is then coated with a layer 3 of an electrically conductive material as shown in FIG. 2. As electrically conductive material gold, carbon or thin plastic layers which have been modified so as to be conductive may be utilized. Suitable processes for applying such a layer are, for example, sputtering or vapor deposition.

Figure 3:
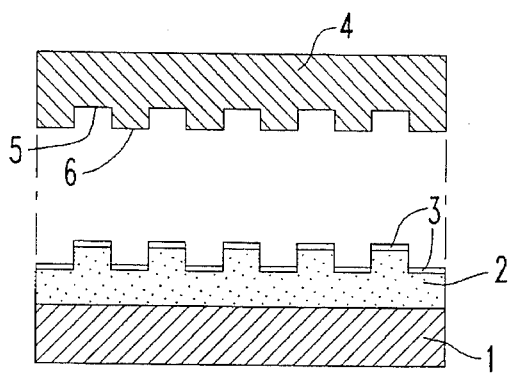
Figure 4:
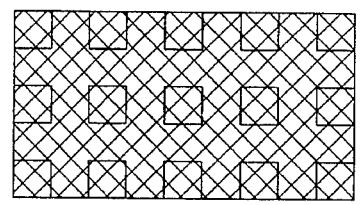
Figure 5:
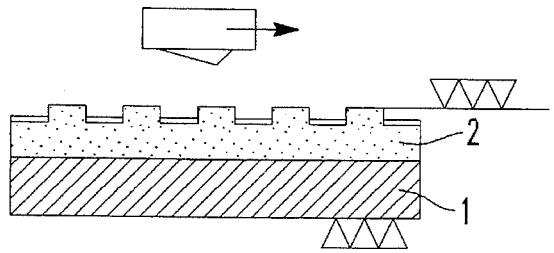

By a vacuum stamping process a metal stamp 4 (form insert) is impressed into the electrically conductive layer 3 as shown in FIGS. 3 and 4. Instead of a vacuum stamping process, other molding procedures such as a reaction casting process may be used. The metal stamp 4 itself is microstructured in accordance with the design requirements for the microstructures to be formed. In most cases, a metal stamp 4 is used for forming the microstructures on the electrically conductive layer 3 which forms a contiguous surface in the structure bases from which isolated microstructures 6 projects. The height of the microstructures 6 is basically unimportant; however with a view to fast and easy mechanical finishing, it should not be too great (about 2 to 5 μm). A small microstructure height is also preferable because the metal stamp can be easily made by optical lithography. Particularly suitable are metal stamps with pyramid-shaped microstructures thereon, as they can be obtained by mechanical micromanufacturing methods. With such structures, it is also possible to vary the width of the electrically insulating gaps between the conductive spangles by choosing the cutting depth.

Figure 6:
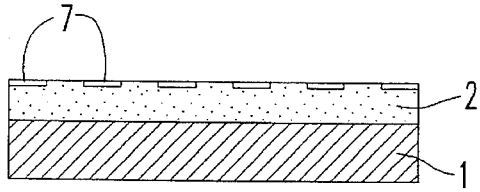
Figure 7:
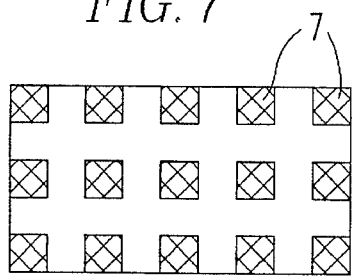

By the microstructuring using the vacuum stamping process, a projection network is formed on the surface of the X-ray resist material. This network including the top layer is cut down by mechanical means (see FIG. 5 such that only isolated spangles of predefined size remain between the network lines while spangles are electrically insulated from one another but carry an electrically conductive surface layer as shown in FIGS. 6 and 7.

Figure 8:
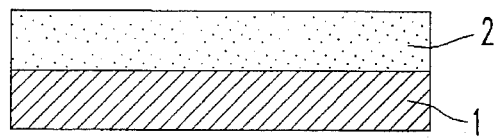
FIG. 8 to FIG. 13 show the process B.
Figure 9:
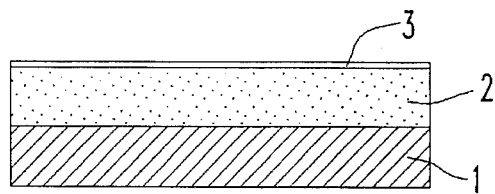
Figure 10:
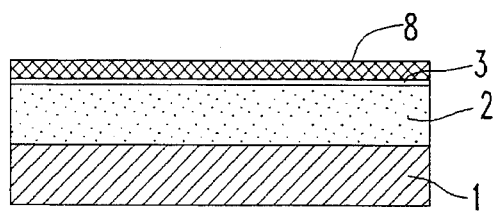

FIGS. 8–13 shows a subtractive microstructuring procedure as represented by process B. Again a metallic base plate 1 is utilized onto which an X-ray resist layer 2 of PMMA is polymerized as shown in FIG. 8. Then a thin electrically conductive layer 3 is applied to the layer 2 as shown in FIG. 9. A light sensitive photo lacquer 8 is then applied to the surface of the electrically conductive layer 3. The thickness of the photo lacquer coating 8 depends on the required structuring accuracy and is usually very thin (0.5 μm) as shown in FIG. 10.

Figure 11:
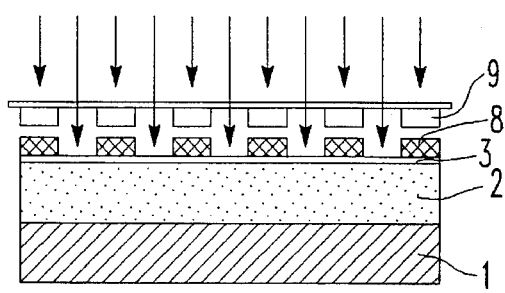

A structure pattern is then generated on the photolayer coating 8 by a lithographic procedure wherein a suitable mask 9 such as a chromium mask, is placed onto the photolacquer coating 8 as shown in FIG. 11.

Figure 12:
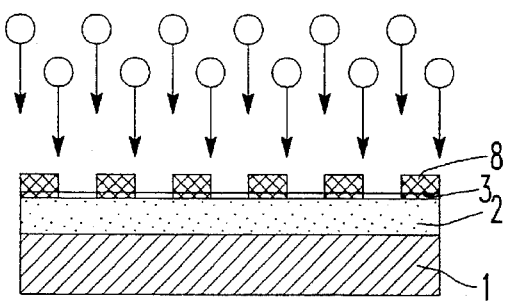

After a grid pattern has been removed from the photo lacquer coating 8 by exposure to light, the exposed portions of the conductive layer 3 are removed by etching. For this procedure, isotropic or anisotropic chemical or physical removal processes are applicable such as liquid chemical etching, plasma etching or reactive ion etching as indicated in FIG. 12.

Figure 13:
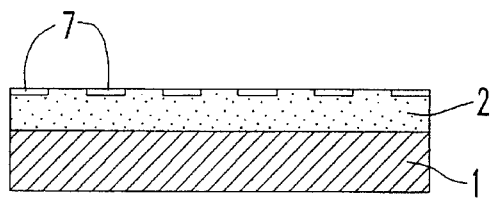

After structuring of the conductive layer 3, the photo lacquer 8 is removed. The then exposed electrically conductive areas form isolated spangles 7 which have electrically conductive surfaces but are insulated from each other as shown in FIG. 13.

Figure 14:
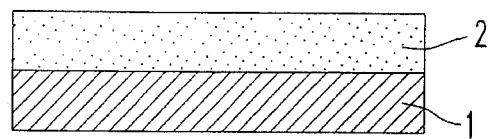
FIG. 14 to FIG. 18 show the process C.
Figure 15:
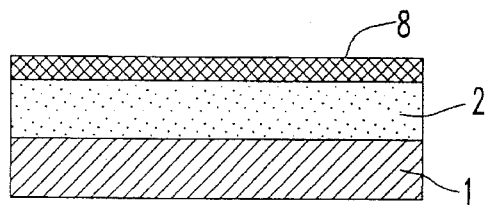
Figure 16:
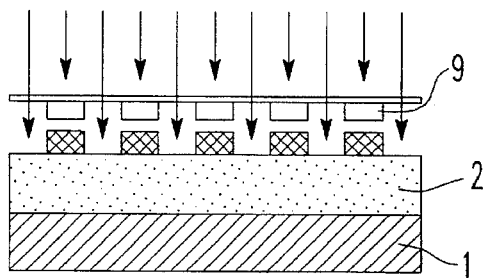

FIGS. 14–18 show an additive microstructuring procedure as represented by process C. A metallic base plate 1 onto which an X-ray resist layer 2 is polymerized as shown in FIG. 14 is coated with a light-sensitive photo lacquer 8 as shown in FIG. 15 and the light sensitive coating is then, like in the previous example, lithographically structured by means of a mask 9 and light exposure as indicated in FIG. 16.

Figure 17:
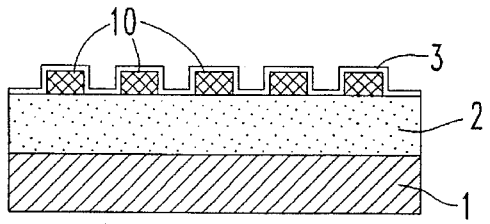

Then an electrically conductive layer 3 is applied to the whole surface including the photolacquer areas as shown in FIG. 17.

Figure 18:
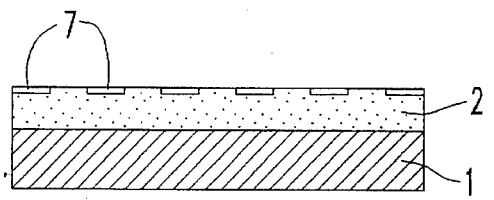

Then the photolacquer areas are removed. In this step also, the front faces 10 of the photolacquer areas carrying the electrically conductive layers 3 are removed. As shown in FIG. 18, the remaining electrically conductive areas form isolated spangles 7 which are electrically insulated from one another like those obtained by processes A and B.

The advantages of the process according to the invention can be summarized as follows: By providing on the front faces of the micro structured bodies a pattern of electrically conductive spangles which, however, are electrically insulated from each other before the galvanic deposition of metal on the microstructured bodies, it is possible to adjust the speed of the lateral growth on the front faces of the micro structured bodies during the galvanic metal deposition to a large extent depending on design requirements for the manufacture of form inserts. According to the LIGA (X-ray lithography and galvanic forming) process this means:

No missing microstructure elements occur in the galvanically formed metal layer which could otherwise occur when a fully conductive resist front face is reached by the build-up of metal relatively early and becomes suddenly fully conductive. As with the arrangement according to the invention, this surface becomes conductive only in steps. Faults which occur without the procedure according to the invention, particularly in the galvanic forming of stepped microstructures, are eliminated;

Changes in the deposition conditions (such as current density) which occur during overgrowth of non-conductive front surfaces and which are difficult to control, become manageable. The surface increases during lateral growth and, accordingly, the changes in current density during the metal deposition procedure can be better predicted. Excessive height differences in the galvanic deposition layer are avoided. The mechanical properties such as internal tensions in the deposited layer can be controlled better and are more uniform.

Below the invention will be described in greater detail on the basis of exemplary embodiments.

An X-ray resist layer of PMMA was applied to a metallic base plate and a gold layer of 50 nm thickness was then sputtered onto the X-ray resist layer. At a temperature of 160° C., a metal stamp was then pressed onto this layer in a vacuum stamping process for a stamping period of 5 minutes and with a stamping force of 10 kN. The stamp was then removed at a temperature of about 90° C. By this process a protruding comb structure was formed in the resist layer with comb openings of about 20 µm and a web width of about 4 µm. The overall height of the comb/web structures was about 4.3 µm.

By grinding down the projecting comb webs (by wet grinding with a grinder having grain size 1200), the combwebs were cut down to the structure base whereby an essentially planar resist surface was obtained having now, however, comb-shaped gold deposits with 20 µm openings separated from each other by insulating resist surface areas 4 µm wide.

In order to plane remainders of the web structure possibly still present, the resist surface was pressed against the plane plate in an additional vacuum stamping step under the same conditions as described above (method according to process A).

The speed of the lateral growth during galvanic deposition was measured with resist surfaces pretreated in this manner without first forming microstructures. In this test, extremely wide microstructure body front surfaces were insulated.

The speed of lateral growth was checked by coveting the sample in a nickel sulfamate bath as it is normally used for galvanizing with nickel at a current density of 1 A/din$^2$. Subsequently, the surface profile of the deposited nickel layer was measured at various places. From the relation of lateral growth to vertical growth over the contact surfaces, the ratio of the two growth speeds was determined.

In accordance with the above equation, with the geometry present, the lateral growth was calculated to be greater than the vertical growth by a factor of 5.3. By the measurement procedure described above on the other hand, an average factor of 4.9 with a standard deviation of 0.24 was calculated.

The height profile of the galvanic deposition showed an essentially linear decline in the direction of lateral growth. This result was reproduced in several additional tests.

In another example, a resist layer (PMMA, about 200 µm thick) was polymerized onto to a base plate (Cu) and treated like in the previous example to form spangles on its surface. The so prepared sample was then subjected to X-ray lithography wherein it was covered with an X-ray mask and exposed to synchrotron radiation. The irradiated areas were dissolved in a developing bath such that as product a metallic base plate was obtained onto which plastic microstructures were disposed which had front surfaces with electrically conductive spangles disposed thereon such that they were insulated from each other. In a subsequent galvanic deposition procedure, metal was deposited on this base plate in a bath (nickel sulfamate at a current density of 1 A/dm$^2$) until the microstructures were completely covered with metal. It was found that the front surfaces were covered with metal substantially faster than spangle-free surfaces and that the height differences of the galvanic depositions were substantially smaller than in previous tests in which no electrically conductive spangles were disposed on the front surfaces. The front faces of the microstructure were more than 1 mm wide at certain points.

What is claimed is:

1. A process for galvanically forming a structured plate, comprising the steps of:

a) providing a layer of a plastic material, b) structuring said plastic material layer at one side thereof such that structure bodies with planar front surfaces are formed thereon, c) the structuring being done in such a way that the structure bodies rise from a structure base which forms contiguous electrically conductive surfaces and said front surfaces of said structure bodies extend parallel to said structure base, d) providing on said front surfaces isolated spangles of an electrically conductive material which are electrically insulated from each other by:
   d.1) coating said plastic material surfaces to be structured with an electrically conductive material,
   d.2) impressing a structured metal stamp into the surface coated with said electrically conductive material such that the coating of electrically conductive material is divided into a part disposed at the bottom of recesses formed into said plastic material layer by said impressing step and a part remaining on the raised front surface areas of said structure bodies and
   d.3) cutting the raised front surface areas with the electrically conductive material thereon down to the electrically conductive material in said recesses which remains on the front surfaces of said structure bodies and then forms said isolated electrically conductive spangles sized and arranged at a distance from each other such that a line across the front surfaces of a structure body in any direction intersects at least one of said spangles and
e) galvanically covering said structure base and said structure bodies with a metal to form said structured plate on said layer of plastic material.

2. A process according to claim 1, wherein said layer of plastic material consists of a thermoplast.

3. A process for galvanically forming a structured plate, comprising the steps of:
   a) providing a layer of a plastic material,
   b) structuring said plastic material layer at one side thereof such that structure bodies with planar front surfaces are formed thereon,
   c) the structuring being done in such a way that said structure bodies rise from a structure base which forms a contiguous electrically conductive surface and the front surfaces of said structure bodies extend parallel to the structure base,
   d) providing on said front surfaces isolated spangles of an electrically conductive material which are electrically insulated from each other by:
      d.1) applying a layer of electrically conductive material on said front surfaces,
      d.2) coating said electrically conductive material on said front surfaces with a layer of a light sensitive photolacquer,
      d.3) placing on said photolacquer layer a mask with light transmissive areas and opaque areas where said spangles are to be provided,
      d.4) exposing said front surfaces with said mask disposed thereon to light,
      d.5) eliminating said photolayer coating under said light transmissive areas and said layer of electrically conductive material underneath, and
      d.6) removing the non-irradiated photolacquer layer so as to expose the electrically conductive areas underneath thereby providing said spangles which are sized and arranged at a distance from each other such that a line across the front surfaces of a structure body in any direction intersects at least one of said spangles and
   e) galvanically covering said structure base and said structure bodies with a metal to form said structured plate on said layer of plastic material.

4. A process for galvanically forming structured plate shaped bodies, comprising the steps of:
   a) providing a layer of a plastic material,
   b) structuring said plastic material layer at one side thereof such that structure bodies with planar front surfaces are formed thereon,
   c) the structuring being done in such a way that said structure bodies rise from a structure base which forms a contiguous electrically conductive surface and said structure bodies have front surfaces which extend parallel to said structure base.
   d) providing on said front surfaces isolated spangles of an electrically conductive material which are electrically insulated from each other by:
      d.1) coating said front surfaces of said structure bodies with a layer of a light sensitive photolacquer,
      d.2) placing on said light sensitive photolayer a mask with light transmissive areas where said spangles of electrically conductive material are to be formed on the front surfaces underneath,
      d.3) exposing said mask to light,
      d.4) removing the light irradiated areas of said photolacquer layer to form recesses where said spangles are to be formed,
      d.4) covering said front surfaces with an electrically conductive material and
      d.5) machining said front surfaces to remove the light conductive material from said front surfaces except for the conductive material in said recesses thereby forming said isolated spangles of conductive material on said front surfaces of said structure bodies so that they are sized and arranged at a distance from each other such that a line across the front surfaces of a structure body in any direction intersects at least one of said spangles and
   e) galvanically covering said structure base and said structure bodies with a metal to form said structured plate on said layer of plastic material.

* * * * *